United States Patent
Hori et al.

(10) Patent No.: US 10,865,501 B2
(45) Date of Patent: Dec. 15, 2020

(54) SILICON CARBIDE EPITAXIAL SUBSTRATE AND METHOD OF MANUFACTURING SILICON CARBIDE SEMICONDUCTOR DEVICE

(71) Applicant: Sumitomo Electric Industries, Ltd., Osaka-shi (JP)

(72) Inventors: Tsutomu Hori, Itami (JP); Hironori Itoh, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 144 days.

(21) Appl. No.: 15/754,097

(22) PCT Filed: Jul. 4, 2016

(86) PCT No.: PCT/JP2016/069800
§ 371 (c)(1),
(2) Date: Feb. 21, 2018

(87) PCT Pub. No.: WO2017/043165
PCT Pub. Date: Mar. 16, 2017

(65) Prior Publication Data
US 2018/0245238 A1    Aug. 30, 2018

(30) Foreign Application Priority Data
Sep. 11, 2015    (JP) .................. 2015-179559

(51) Int. Cl.
*H01L 21/02* (2006.01)
*C30B 29/36* (2006.01)
(Continued)

(52) U.S. Cl.
CPC ............ *C30B 29/36* (2013.01); *C30B 25/183* (2013.01); *C30B 25/20* (2013.01);
(Continued)

(58) Field of Classification Search
CPC ....... C30B 29/36; C30B 25/183; C30B 25/20; H01L 21/02236; H01L 21/02378;
(Continued)

(56) References Cited

U.S. PATENT DOCUMENTS

| 6,734,461 B1 | 5/2004 | Shiomi et al. |
| 2007/0269980 A1* | 11/2007 | Rayfield ............. B28D 5/0076 |
|  |  | 438/678 |
| 2016/0237590 A1 | 8/2016 | Daikoku et al. |

FOREIGN PATENT DOCUMENTS

| JP | 2006-186105 A | 7/2006 |
| JP | 2013-184860 A | 9/2013 |

(Continued)

OTHER PUBLICATIONS

Yongqiang Sun, Gan Feng, Liping Lv, Weining Qian, Yiyang Li, Jinyun Luo, and Jianhui zhang, 150 mm 4H-SiC Epitaxial Layer Growth in a Warm-Wall Planetary Reactor, Jun. 2015, Trans Tech Publications, Switzerland, Materials Science Forum vols. 821-823 (2015) pp. 153-156 (Year: 2015).*

(Continued)

*Primary Examiner* — Yu-Hsi D Sun
*Assistant Examiner* — Pavel G Ivanov
(74) *Attorney, Agent, or Firm* — Baker Botts L.L.P.; Michael A. Sartori

(57) ABSTRACT

A silicon carbide epitaxial substrate has a silicon carbide single-crystal substrate and a silicon carbide layer. A first ratio of an absolute value of a difference between a dopant density in a first end region and a dopant density in a central region to an average value of the dopant density in the first end region and the dopant density in the central region is not more than 40%. A second ratio of an absolute value of a difference between a dopant density in a second end region and the dopant density in the central region to an average
(Continued)

value of the dopant density in the second end region and the dopant density in the central region is not more than 40%.

5 Claims, 8 Drawing Sheets

(51) Int. Cl.
C30B 25/18 (2006.01)
C30B 25/20 (2006.01)
H01L 21/04 (2006.01)
H01L 21/78 (2006.01)
H01L 29/16 (2006.01)
H01L 29/66 (2006.01)
H01L 29/78 (2006.01)
H01L 29/08 (2006.01)
H01L 29/739 (2006.01)
H01L 29/745 (2006.01)

(52) U.S. Cl.
CPC .... H01L 21/0262 (2013.01); H01L 21/02236 (2013.01); H01L 21/02378 (2013.01); H01L 21/02433 (2013.01); H01L 21/02447 (2013.01); H01L 21/02529 (2013.01); H01L 21/02576 (2013.01); H01L 21/02609 (2013.01); H01L 21/046 (2013.01); H01L 21/049 (2013.01); H01L 21/0485 (2013.01); H01L 21/78 (2013.01); H01L 29/1608 (2013.01); H01L 29/66068 (2013.01); H01L 29/7802 (2013.01); H01L 21/02634 (2013.01); H01L 29/0878 (2013.01); H01L 29/7395 (2013.01); H01L 29/7455 (2013.01)

(58) Field of Classification Search
CPC ............. H01L 21/02529; H01L 21/046; H01L 21/0485; H01L 21/049; H01L 21/78; H01L 29/1608; H01L 29/66068; H01L 29/7802; H01L 21/02634; H01L 29/0878; H01L 29/7395; H01L 29/7455; H01L 21/02433; H01L 21/02447; H01L 21/02576; H01L 21/02609; H01L 21/0262
See application file for complete search history.

(56) References Cited

FOREIGN PATENT DOCUMENTS

| | | |
|---|---|---|
| JP | 2014-116331 A | 6/2014 |
| JP | 2014-144880 A | 8/2014 |
| JP | 2014-170891 A | 9/2014 |
| JP | 2014-231457 A | 12/2014 |
| JP | 2015-067479 A | 4/2015 |
| JP | 2015-119083 A | 6/2015 |
| JP | 2015-143168 A | 8/2015 |
| JP | 2015-146416 A | 8/2015 |
| WO | 01/18872 A1 | 3/2001 |
| WO | 2015/114961 A1 | 8/2015 |

OTHER PUBLICATIONS

J. Nishio, H. Asamizu, C. Kudou, S. Ito, K. Masumoto, K. Tamural, K. Kojima and T. Ohno, Uniformity Improvement in Carrier Concentration on 150 mm Diameter C-face Epitaxial Growth of 4H-SiC, Jun. 2015, Trans Tech Publications, Switzerland, Materials Science Forum vols. 821-823 (2015) pp. 169-172 (Year: 2015).*

Jie Zhang, Bernd Thomas, Kevin Moeggenborg, Victor M Torres, Darren Hansen, Progress of SiC epitaxy on 150mm substrates, Jun. 2015, Trans Tech Publications, Switzerland, Materials Science Forum vols. 821-823 (2015) pp. 161-164 (Year: 2015).*

Hiroaki Fujibayashi, Masahiko Ito, Hideki Ito, et al, Development of a 150mm 4H-SiC epitaxial reactor with high-speed wafer rotation, Dec. 18, 2013, IOPscience, Applied Physics Express 7, 015502 (2014) (Year: 2013).*

Tobias Höchbauera, Mario Leitner, Ronny Kern, Matthias Künle, SiC Epitaxial Growth in a 7×100mm / 3×150mm Horizontal Hot Wall Batch Reactor, Trans Tech Publications, Switzerland, Jun. 2015, Materials Science Forum ISSN: 1662-9752, vols. 821-823, pp. 165-168 (Year: 2015).*

Albert A. Burk, Development of Multiwafer Warm-Wall Planetary VPE Reactors for SiC Device Production, Aug. 21, 2006, Wiley-VCH Verlag GmbH & Co. KGaA, Weinheim, Chem. Vap. Deposition 2006, 12, 465-473 (Year: 2006).*

* cited by examiner

SILICON CARBIDE EPITAXIAL SUBSTRATE AND METHOD OF MANUFACTURING SILICON CARBIDE SEMICONDUCTOR DEVICE

TECHNICAL FIELD

The present disclosure relates to a silicon carbide epitaxial substrate and a method of manufacturing a silicon carbide semiconductor device. The present application claims priority to Japanese Patent Application No. 2015-179559 filed on Sep. 11, 2015, the entire contents of which are incorporated herein by reference.

BACKGROUND ART

Japanese Patent Laying-Open No. 2014-170891 (PTD 1) discloses a method of forming a silicon carbide layer on a silicon carbide single-crystal substrate by epitaxial growth.

CITATION LIST

Patent Document

PTD 1: Japanese Patent Laying-Open No. 2014-170891

SUMMARY OF INVENTION

A silicon carbide epitaxial substrate according to the present disclosure includes a silicon carbide single-crystal substrate and a silicon carbide layer. The silicon carbide single-crystal substrate includes a first main surface. The silicon carbide layer is on the first main surface. The silicon carbide layer includes a second main surface opposite to a surface thereof in contact with the silicon carbide single-crystal substrate. The second main surface has a maximum diameter of not less than 100 mm. The silicon carbide single-crystal substrate and the silicon carbide layer are provided with a linear orientation flat. The silicon carbide layer has a central region, a first end region and a second end region. The central region is located 2 μm away from a center of the second main surface toward the first main surface in a direction perpendicular to the second main surface. The first end region is located on a plane vertically bisecting the orientation flat when viewed from the direction perpendicular to the second main surface, and is located 1 mm away from the orientation flat toward the central region. The second end region is in a direction circumferentially rotated 90° counterclockwise from the first end region when viewed from the central region, and is located 1 mm away from an outer edge of the silicon carbide layer toward the central region. The silicon carbide layer has a thickness of not less than 5 μm. A first ratio of an absolute value of a difference between a dopant density in the first end region and a dopant density in the central region to an average value of the dopant density in the first end region and the dopant density in the central region is not more than 40%. A second ratio of an absolute value of a difference between a dopant density in the second end region and the dopant density in the central region to an average value of the dopant density in the second end region and the dopant density in the central region is not more than 40%.

DESCRIPTION OF EMBODIMENTS

Figure 1:
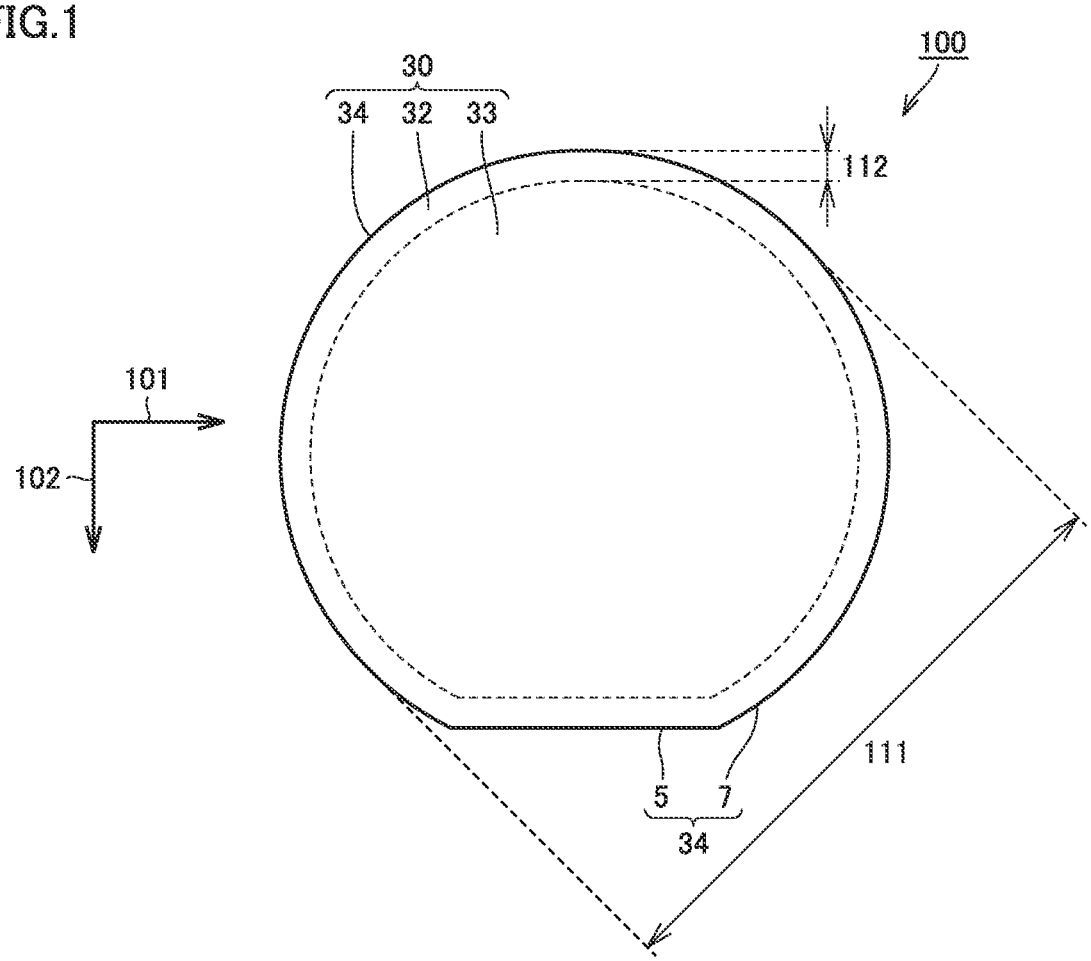
FIG. 1 is a schematic plan view showing the configuration of a silicon carbide epitaxial substrate according to the present embodiment.

Description of Embodiment of the Present Disclosure

An embodiment of the present disclosure is described first. In the following description, the same or corresponding elements are designated by the same symbols and the same description thereof will not be repeated. Regarding crystallographic indications herein, an individual orientation is represented by [ ], a group orientation is represented by < >, an individual plane is represented by ( ), and a group plane is represented by { }. Although a crystallographically negative index is normally expressed by a number with a bar "–" thereabove, a negative sign herein precedes a number to indicate a crystallographically negative index.

(1) A silicon carbide epitaxial substrate 100 according to the present disclosure includes a silicon carbide single-crystal substrate 10 and a silicon carbide layer 20. Silicon carbide single-crystal substrate 10 includes a first main surface 11. Silicon carbide layer 20 is on first main surface 11. Silicon carbide layer 20 includes a second main surface 30 opposite to a surface 14 thereof in contact with silicon carbide single-crystal substrate 10. Second main surface 30 has a maximum diameter of not less than 100 mm. Silicon carbide single-crystal substrate 10 and silicon carbide layer 20 are provided with a linear orientation flat 5. Silicon carbide layer 20 has a central region 33, a first end region 31 and a second end region 32. Central region 33 is located 2 µm away from a center 35 of second main surface 30 toward first main surface 11 in a direction perpendicular to second main surface 30. First end region 31 is located on a plane vertically bisecting orientation flat 5 when viewed from the direction perpendicular to second main surface 30, and is located 1 mm away from orientation flat 5 toward central region 33. Second end region 32 is in a direction circumferentially rotated 90° counterclockwise from first end region 31 when viewed from central region 33, and is located 1 mm away from an outer edge 34 of silicon carbide layer 20 toward central region 33. Silicon carbide layer 20 has a thickness of not less than 5 µm. A first ratio of an absolute value of a difference between a dopant density in first end region 31 and a dopant density in central region 33 to an average value of the dopant density in first end region 31 and the dopant density in central region 33 is not more than 40%. A second ratio of an absolute value of a difference between a dopant density in second end region 32 and the dopant density in central region 33 to an average value of the dopant density in second end region 32 and the dopant density in central region 33 is not more than 40%.

When forming a silicon carbide layer by epitaxial growth, the silicon carbide layer is formed on a silicon carbide single-crystal substrate while the silicon carbide single-crystal substrate is rotated. Thus, even if the concentration of a source material gas (also including a dopant gas) on the silicon carbide single-crystal substrate is not uniform, it is believed that a dopant density in the silicon carbide layer formed on the silicon carbide single-crystal substrate will be balanced because the silicon carbide single-crystal substrate is rotated. In actuality, however, the dopant density tends to be higher in an outer circumferential region than in a central region of the silicon carbide layer.

The inventors examined the causes of the higher dopant density in the outer circumferential region than in the central region of the silicon carbide layer. As a result, it was found that disturbance in a flow of the source material gas was one of the causes. Specifically, it is believed that the source material gas enters a gap between a side surface of a recess provided in a susceptor plate and a side surface of the silicon carbide single-crystal substrate disposed in this recess, causing disturbance in the flow of the source material gas. It is also believed that, because the thickness of the silicon carbide single-crystal substrate is smaller than the depth of this recess, disturbance occurs in the flow of the source material gas flowing over the silicon carbide single-crystal substrate. It is considered that the flow of the source material gas is disturbed in the vicinity of the outer circumference of the silicon carbide single-crystal substrate, causing the dopant density in the outer circumferential region to be higher than the dopant density in the central region.

Electric field concentration at an outer circumferential corner of the susceptor plate is also believed to be one of the causes. Specifically, when the susceptor plate is heated by induction heating, the electric field is concentrated at an outer circumferential corner of the susceptor plate. This causes the temperature of the outer circumferential corner of the susceptor plate to be higher than the temperature of the remaining portion of the susceptor plate. This in turn causes the temperature of the outer circumferential region of the silicon carbide single-crystal substrate near this outer circumferential corner to be higher than the temperature of the central region. It is believed that the dopant density in the outer circumferential region consequently becomes higher than the dopant density in the central region.

Based on these findings, the inventors configured the susceptor plate as will be described later. The disturbance in the flow of the source material gas on the silicon carbide single-crystal substrate can thereby be suppressed. In addition, the effect of the electric field concentration at the outer circumferential corner of the susceptor plate on the silicon carbide single-crystal substrate can be suppressed. As a result, the difference between the dopant density in the central region and the dopant density in the outer circumferential region can be reduced.

(2) In silicon carbide epitaxial substrate 100 according to (1) above, the first ratio may be not more than 30%.

(3) In silicon carbide epitaxial substrate 100 according to (2) above, the first ratio may be not more than 20%.

(4) In silicon carbide epitaxial substrate 100 according to any one of (1) to (3) above, the second ratio may be not more than 30%.

(5) In silicon carbide epitaxial substrate 100 according to (4) above, the second ratio may be not more than 20%.

(6) In silicon carbide epitaxial substrate 100 according to (1) above, the maximum diameter may be not less than 150 mm.

(7) A method of manufacturing a silicon carbide semiconductor device 300 according to the present disclosure includes the following steps. Silicon carbide epitaxial substrate 100 according to any one of (1) to (6) above is prepared. Silicon carbide epitaxial substrate 100 is processed.

Details of Embodiment of the Present Disclosure

One embodiment of the present disclosure (hereinafter also referred to as "the present embodiment") is described below. However, the present embodiment is not limited as such.

(Silicon Carbide Epitaxial Substrate)

As shown in FIGS. 1 to 4, a silicon carbide epitaxial substrate 100 according to the present embodiment has a silicon carbide single-crystal substrate 10 and a silicon carbide layer 20. Silicon carbide single-crystal substrate 10 includes a first main surface 11, and a third main surface 13 opposite to first main surface 11. Silicon carbide layer 20 includes a fourth main surface 14 in contact with silicon carbide single-crystal substrate 10, and a second main surface 30 opposite to fourth main surface 14. As shown in FIG. 1, silicon carbide epitaxial substrate 100 may have an orientation flat 5 extending in a first direction 101. Silicon carbide epitaxial substrate 100 may have a second flat (not shown) extending in a second direction 102. First direction 101 is a <11-20> direction, for example. Second direction 102 is a <1-100> direction, for example.

Silicon carbide single-crystal substrate 10 (hereinafter sometimes abbreviated as "single-crystal substrate") is made of a silicon carbide single crystal. This silicon carbide single crystal has a polytype of 4H—SiC, for example. The 4H—SiC has better electron mobility, dielectric breakdown electric field strength and the like than other polytypes. Silicon carbide single-crystal substrate 10 includes an n type impurity such as nitrogen (N). Silicon carbide single-crystal substrate 10 has n type conductivity, for example. First main surface 11 is a {0001} plane or a plane tilted not more than 8° from the {0001} plane, for example. When first main surface 11 is tilted from the {0001} plane, a tilt direction of the normal of first main surface 11 is the <11-20> direction, for example.

Figure 3:
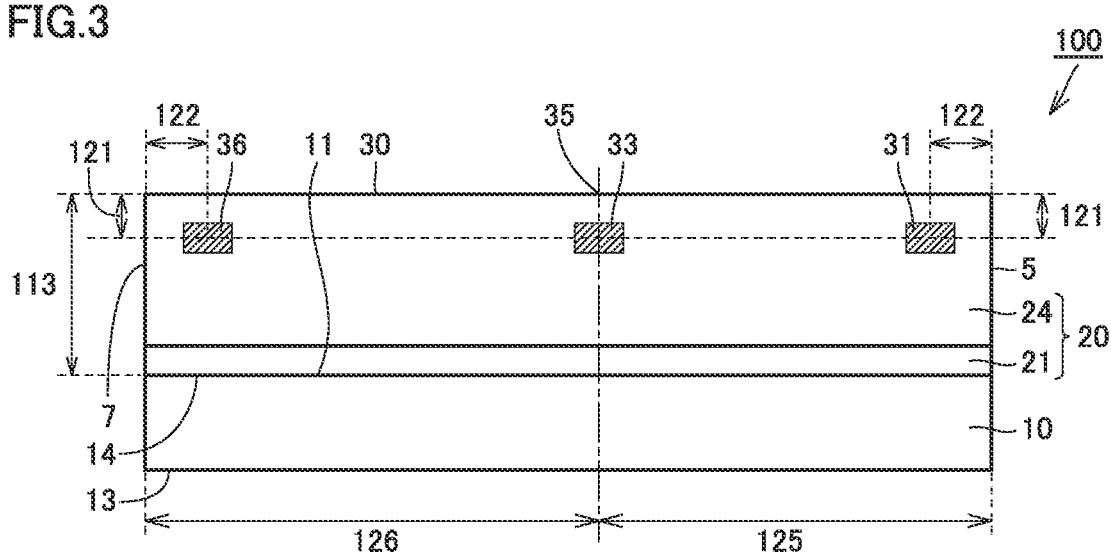
FIG. 3 is a schematic sectional view taken along line in a direction of arrows in FIG. 2.
Figure 4:
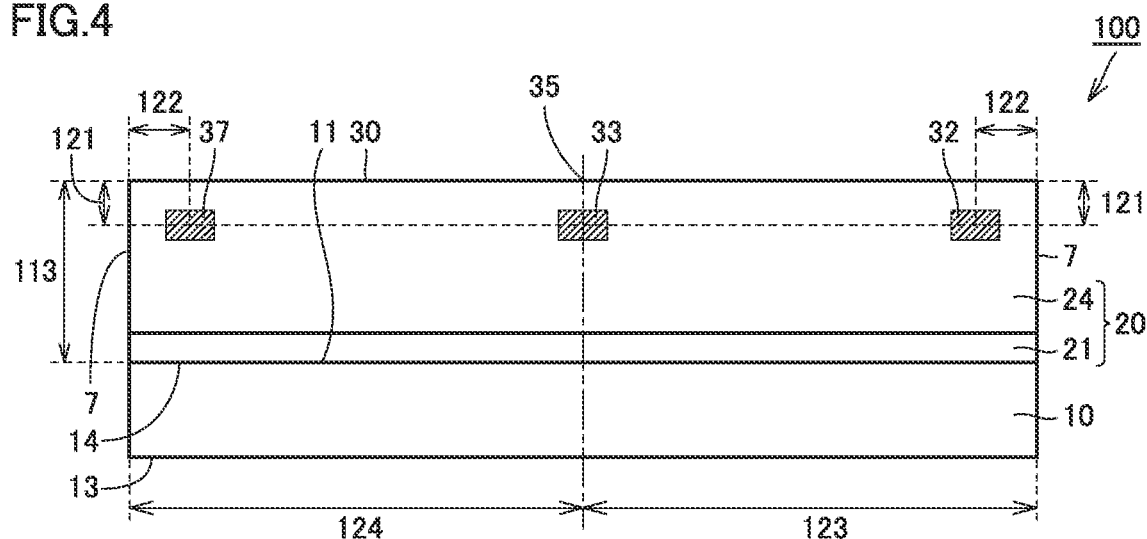
FIG. 4 is a schematic sectional view taken along line IV-IV in a direction of arrows in FIG. 2.

As shown in FIGS. 3 and 4, silicon carbide layer 20 is an epitaxial layer formed on silicon carbide single-crystal substrate 10. Silicon carbide layer 20 is on first main surface 11. Silicon carbide layer 20 is in contact with first main surface 11. Silicon carbide layer 20 includes an n type impurity such as nitrogen. Silicon carbide layer 20 has n type conductivity, for example. The concentration of the n type impurity included in silicon carbide layer 20 may be lower than the concentration of the n type impurity included in silicon carbide single-crystal substrate 10. As shown in FIG. 1, second main surface 30 has a maximum diameter 111 (diameter) of not less than 100 mm. The diameter of maximum diameter 111 may be not less than 150 mm, not less than 200 mm, or not less than 250 mm. The upper limit of maximum diameter 111 is not particularly limited. The upper limit of maximum diameter 111 may be 300 mm, for example.

Second main surface 30 may be a {0001} plane or a plane tilted not more than 8° from the {0001} plane, for example. Specifically, second main surface 30 may be a (0001) plane or a plane tilted not more than 8° from the (0001) plane. A tilt direction (off direction) of the normal of second main surface 30 may be the <11-20> direction, for example. A tilt angle (off angle) from the {0001} plane may be not less than 1°, or not less than 2°. The off angle may be not more than 7°, or not more than 6°.

As shown in FIGS. 3 and 4, silicon carbide layer 20 has a buffer layer 21 and a drift layer 24. The concentration of the n type impurity included in drift layer 24 may be lower than the concentration of the n type impurity included in buffer layer 21. Drift layer 24 forms second main surface 30. Buffer layer 21 forms fourth main surface 14. Silicon carbide layer 20 has a thickness 113 of not less than 5 μm. Thickness 113 may be not less than 10 μm, or not less than 15 μm.

Figure 2:
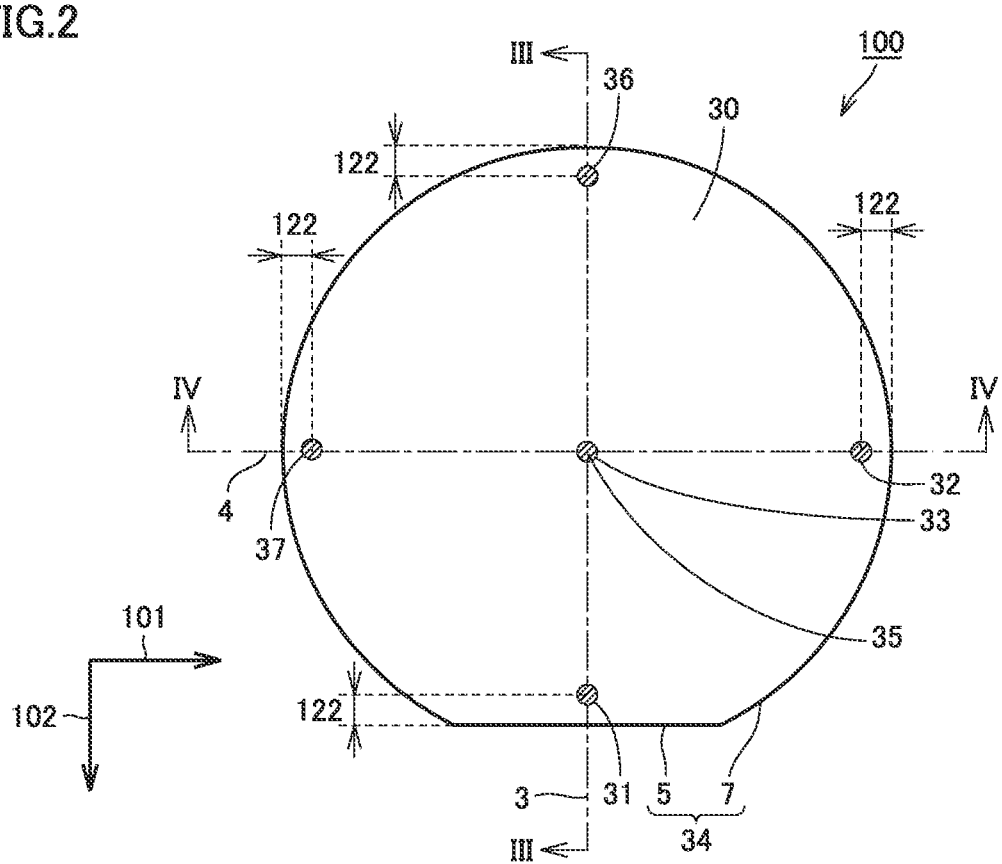
FIG. 2 is a schematic plan view showing measurement positions of carrier concentration.

As shown in FIG. 2, silicon carbide layer 20 and silicon carbide single-crystal substrate 10 are provided with linear orientation flat 5. An outer edge 34 of silicon carbide epitaxial substrate 100 includes an arc portion 7 and linear orientation flat 5. The center of a circumscribed circle of a triangle formed by any three points on arc portion 7 may be a center 35 of second main surface 30.

As shown in FIGS. 2 to 4, silicon carbide layer 20 has a central region 33, a first end region 31, a second end region 32, a third end region 36, and a fourth end region 37. Central region 33 is located (fifth position) 2 μm away from center 35 of second main surface 30 toward first main surface 11 in a direction perpendicular to second main surface 30. Put another way, a distance 121 from the fifth position to second main surface 30 is 2 μm in the direction perpendicular to second main surface 30. Central region 33 is a region within 1 μm from the fifth position in each of the direction perpendicular to second main surface 30 and a direction parallel to second main surface 30, for example. A distance from second main surface 30 to an upper end surface of central region 33 is 1 μm, for example, in the direction perpendicular to second main surface 30.

As shown in FIGS. 2 and 3, first end region 31 is located on a plane 3 vertically bisecting orientation flat 5 when viewed from the direction perpendicular to second main surface 30, and is located (first position) 1 mm away from orientation flat 5 toward central region 33. Put another way, a shortest distance 122 from the first position to orientation flat 5 is 1 mm in a radial direction of second main surface 30. The first position and the fifth position are on plane 3. Plane 3 is parallel to second direction 102, for example. First end region 31 is a region within 1 μm from the first position in each of the direction perpendicular to second main surface 30 and the direction parallel to second main surface 30, for example. A distance from second main surface 30 to an upper end surface of first end region 31 is 1 μm, for example, in the direction perpendicular to second main surface 30.

As shown in FIGS. 2 and 4, second end region 32 is in a direction circumferentially rotated 90° counterclockwise from first end region 31 when viewed from central region 33, and is located (second position) 1 mm away from outer edge 34 toward central region 33 of silicon carbide layer 20. Put another way, shortest distance 122 from the second position to outer edge 34 is 1 mm in the radial direction of second main surface 30. The fifth position and the second position are on a plane 4. Plane 4 is parallel to first direction 101, for example. Plane 4 is perpendicular to plane 3, and is perpendicular to second main surface 30. Second end region 32 is a region within 1 μm from the second position in each of the direction perpendicular to second main surface 30 and the direction parallel to second main surface 30, for example. A distance from second main surface 30 to an upper end surface of second end region 32 is 1 μm, for example, in the direction perpendicular to second main surface 30.

As shown in FIGS. 2 and 3, third end region 36 is located opposite to first end region 31 when viewed from central region 33. Third end region 36 is in a direction circumferentially rotated 90° counterclockwise from second end region 32 when viewed from central region 33, and is located (third position) 1 mm away from outer edge 34 toward central region 33 of silicon carbide layer 20. The third position, the fifth position and the first position are on plane 3.

As shown in FIGS. 2 and 4, fourth end region 37 is located opposite to second end region 32 when viewed from central region 33. Fourth end region 37 is in a direction circumferentially rotated 90° counterclockwise from third end region 36 when viewed from central region 33, and is located (fourth position) 1 mm away from outer edge 34 toward central region 33 of silicon carbide layer 20. The fourth position, the fifth position and the fourth position are on plane 4.

As shown in FIG. 3, a distance 125 from center 35 of second main surface 30 to orientation flat 5 may be shorter than a distance 126 from center 35 to arc portion 7. As shown in FIG. 4, a distance 123 from center 35 to arc portion 7 on one side may be equal to a distance 124 from center 35 to arc portion 7 on the other side.

(Ratio of Dopant Densities)

Silicon carbide layer 20 includes nitrogen, for example, as a dopant. According to silicon carbide epitaxial substrate 100 in accordance with the present disclosure, a ratio (first ratio) of an absolute value of a difference between a dopant density in first end region 31 and a dopant density in central region 33 to an average value of the dopant density in first end region 31 and the dopant density in central region 33 is not more than 40%. A ratio (second ratio) of an absolute value of a difference between a dopant density in second end region 32 and the dopant density in central region 33 to an average value of the dopant density in second end region 32 and the dopant density in central region 33 is not more than 40%. The first ratio may be not more than 35%, not more than 30%, not more than 25%, or not more than 20%. The second ratio may be not more than 35%, not more than 30%, not more than 25%, or not more than 20%.

Assuming that the dopant density in central region 33 is $N_{dc}$, the dopant density in first end region 31 is $N_{de1}$, the dopant density in second end region 32 is $N_{de2}$, the first ratio is R1, and the second ratio is R2, then R1=$|N_{de1}-N_{dc}|/[(N_{de1}+N_{dc})/2]$ is satisfied, and R2=$|N_{de2}-N_{ac}|/[N_{de2}+N_{dc})/2]$ is satisfied.

Preferably, a ratio (third ratio) of an absolute value of a difference between a dopant density in third end region 36 and the dopant density in central region 33 to an average value of the dopant density in third end region 36 and the dopant density in central region 33 is not more than 40%. Preferably, a ratio (fourth ratio) of an absolute value of a difference between a dopant density in fourth end region 37 and the dopant density in central region 33 to an average value of the dopant density in fourth end region 37 and the dopant density in central region 33 is not more than 40%. The third ratio may be not more than 35%, not more than 30%, not more than 25%, or not more than 20%. The fourth ratio may be not more than 35%, not more than 30%, not more than 25%, or not more than 20%.

Assuming that the dopant density in central region 33 is $N_{dc}$, the dopant density in third end region 36 is $N_{de3}$, the dopant density in fourth end region 37 is $N_{de4}$, the third ratio is R3, and the fourth ratio is R4, then R3=$|N_{de3}-N_{dc}|/[N_{de3}+N_{dc})/2]$ is satisfied, and R4=$|N_{de4}-N_{dc}|/[(N_{de4}+N_{dc})/2]$ is satisfied.

Next, a method of measuring the dopant densities is described. The dopant density in each region can be measured by SIMS (Secondary Ion Mass Spectrometry), for example. As the SIMS, the IMS 7f manufactured by Cameca can be used, for example. Measurement conditions of primary ions $O_2^+$ and primary ion energy 8 keV can be used, for example.

(Film Formation Apparatus)

Next, the configuration of a manufacturing apparatus 200 used in a method of manufacturing silicon carbide epitaxial substrate 100 according to the present embodiment is described.

Figure 5:
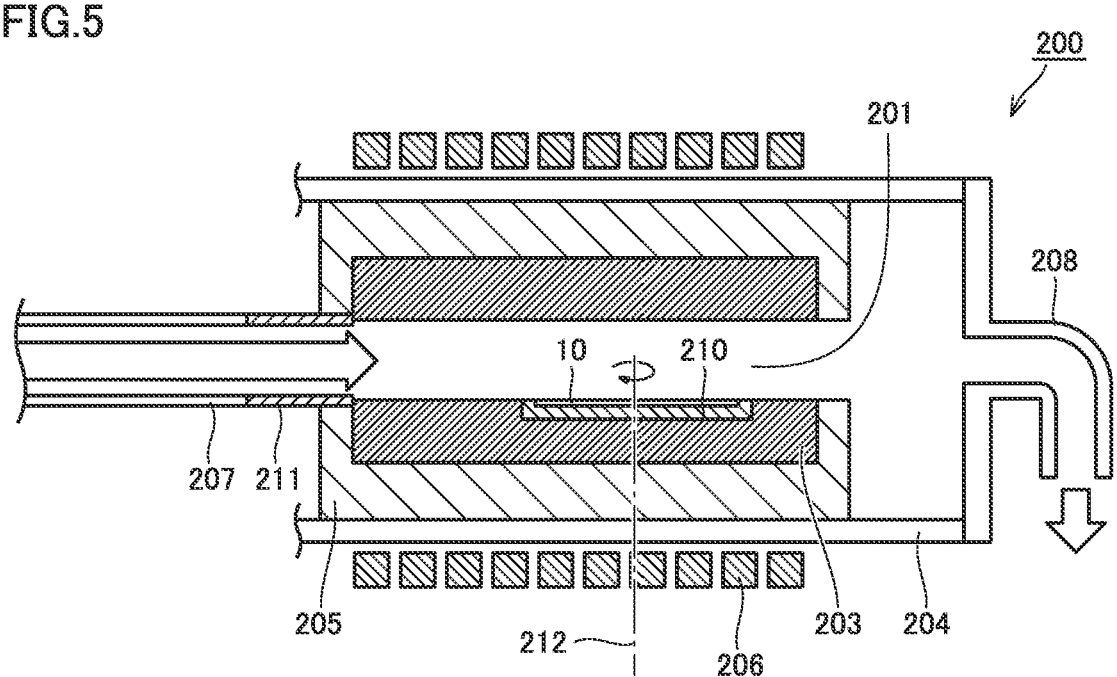
FIG. 5 is a partial schematic sectional view showing the configuration of a manufacturing apparatus for the silicon carbide epitaxial substrate according to the present embodiment.

As shown in FIG. 5, manufacturing apparatus 200 is a hot wall type CVD (Chemical Vapor Deposition) apparatus, for example. Manufacturing apparatus 200 mainly has a heating element 203, a quartz tube 204, a heat insulator 205, an induction heating coil 206, and an auxiliary heating mechanism 211. A hollow portion surrounded by heating element 203 is a reaction chamber 201. Reaction chamber 201 is provided with a susceptor plate 210 holding silicon carbide single-crystal substrate 10. Susceptor plate 210 can rotate around its axis. Silicon carbide single-crystal substrate 10 is placed on susceptor plate 210 with first main surface 11 facing upward.

Heating element 203 is made of graphite, for example. Induction heating coil 206 is wound around and along the outer circumference of quartz tube 204. By supplying a prescribed AC current to induction heating coil 206, heating element 203 is inductively heated. Reaction chamber 201 is thereby heated.

Manufacturing apparatus 200 further has a gas inlet port 207 and a gas outlet port 208. Gas outlet port 208 is connected to an air exhaust pump (not shown). Arrows in FIG. 5 indicate a gas flow. A carrier gas, a source material gas and a doping gas are introduced through gas inlet port 207 into reaction chamber 201, and exhausted through gas outlet port 208. A pressure in reaction chamber 201 is adjusted by a balance between a supplied amount of gas and an exhausted amount of gas.

Usually, susceptor plate 210 and single-crystal substrate 10 are disposed substantially centrally in an axial direction of reaction chamber 201. As shown in FIG. 5, in the present disclosure, susceptor plate 210 and single-crystal substrate 10 may be disposed on the downstream side relative to the center of reaction chamber 201, that is, toward gas outlet port 208. This is to advance decomposition reaction of the source material gas to a sufficient degree before the source material gas reaches single-crystal substrate 10. It is expected that the distribution of a C/Si ratio is thereby rendered uniform in the plane of single-crystal substrate 10.

(Rotary Mechanism)

Figure 6:
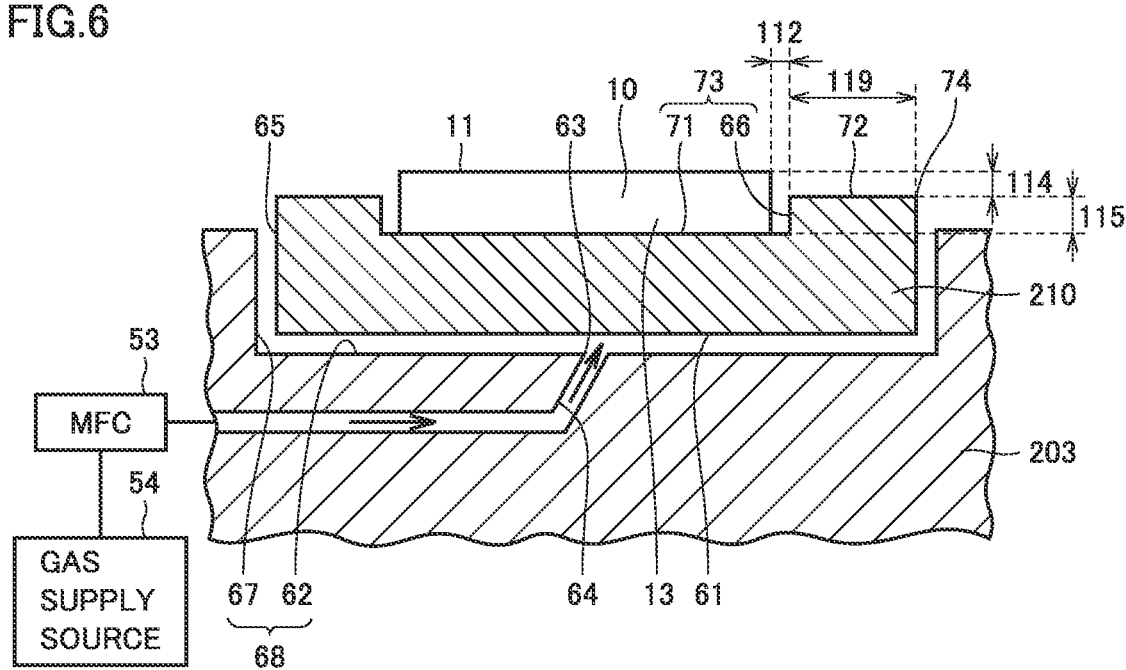
FIG. 6 is a partial schematic sectional view showing the configuration of a susceptor plate of the manufacturing apparatus for the silicon carbide epitaxial substrate according to the present embodiment.

As shown in FIG. 6, manufacturing apparatus 200 may further have an MFC (Mass Flow Controller) 53 and a gas supply source 54. Heating element 203 is provided with a recess 68. Recess 68 is formed of a bottom surface 62 and a side surface 67. Bottom surface 62 is provided with a gas ejection hole 63. Gas ejection hole 63 is communicated with a flow path 64 provided in heating element 203. Gas supply source 54 is configured to be able to supply gas such as hydrogen to flow path 64. MFC 53 is provided between gas supply source 54 and flow path 64. MFC 53 is configured to be able to control a flow rate of the gas supplied from gas supply source 54 to flow path 64. Gas supply source 54 is a gas cylinder capable of supplying inert gas such as hydrogen or argon. Susceptor plate 210 is provided with a recess 73. Recess 73 is formed of a bottom surface 71 and a side surface 66. Silicon carbide single-crystal substrate 10 can be disposed in recess 73.

Figure 7:
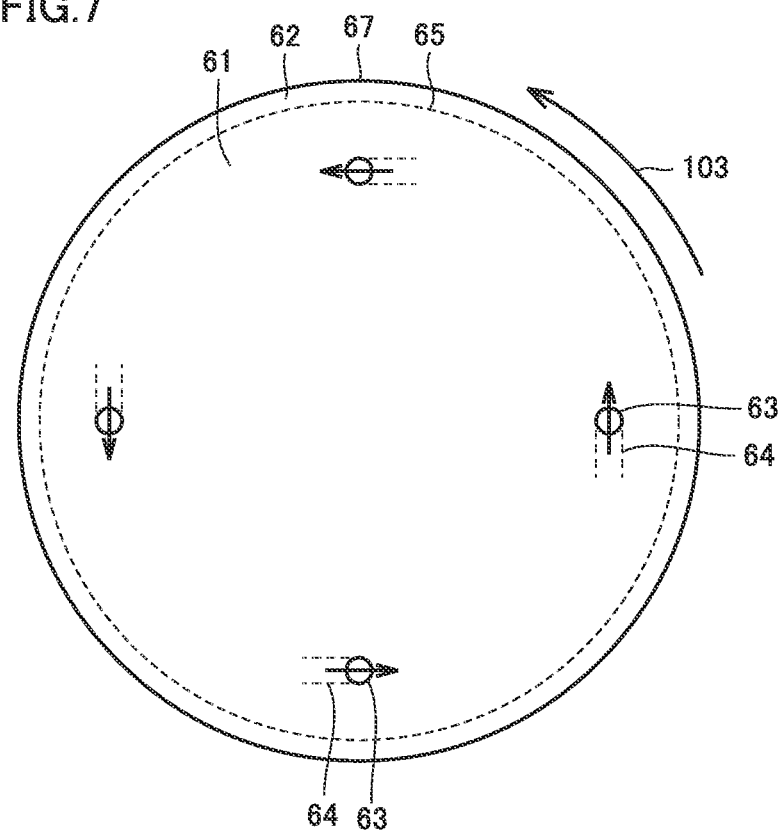
FIG. 7 is a schematic plan view showing the configuration of gas ejection holes in the manufacturing apparatus for the silicon carbide epitaxial substrate according to the present embodiment.

As shown in FIG. 7, bottom surface 62 is provided with a plurality of gas ejection holes 63. When viewed from a direction perpendicular to bottom surface 62, gas ejection holes 63 may be provided at positions of 0°, 90°, 180° and 270°, for example. Each of the plurality of gas ejection holes 63 is configured to be able to eject the gas along a circumferential direction of a bottom surface 61 of susceptor plate 210. When viewed from a direction parallel to bottom surface 62 (in the field of view of FIG. 6), a direction of the gas ejected from gas ejection hole 63 may be tilted relative to bottom surface 61. In FIGS. 6 and 7, a direction of arrows indicates a direction of gas flow. By ejecting the gas to bottom surface 61, susceptor plate 210 floats and rotates in a circumferential direction 103 of silicon carbide single-crystal substrate 10. Susceptor plate 210 rotates in circumferential direction 103, with bottom surface 61 of susceptor plate 210 being spaced from bottom surface 62 of recess 68, and with an outer side surface 65 of susceptor plate 210 being spaced from side surface 67 of recess 68.

(Distance Between Outer Edge of Silicon Carbide Single-Crystal Substrate and Side Surface of Recess)

Figure 8:
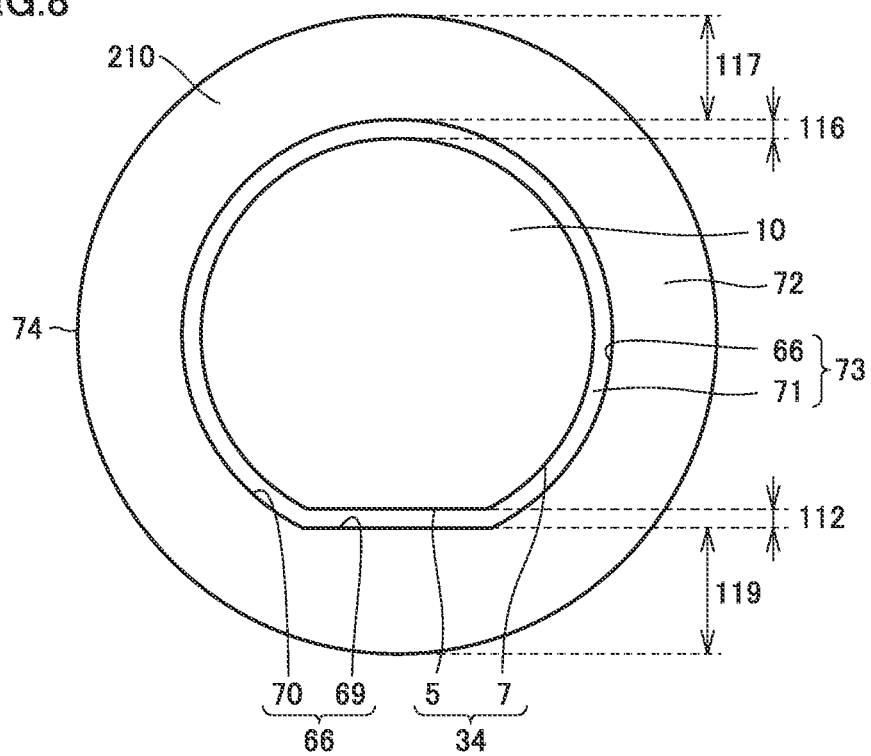
FIG. 8 is a schematic plan view showing the configuration of a first example of the susceptor plate of the manufacturing apparatus for the silicon carbide epitaxial substrate according to the present embodiment.

As shown in FIGS. 6 and 8, side surface 66 of recess 73 provided in susceptor plate 210 is formed of a first portion 69 which is linear in plan view, and a second portion 70 which is curved in plan view. First portion 69 is a portion facing orientation flat 5 of silicon carbide single-crystal substrate 10. Second portion 70 is a portion facing arc portion 7 of silicon carbide single-crystal substrate 10. A distance 112 between first portion 69 and orientation flat 5 is not more than 1 mm in a direction parallel to bottom surface 61 of susceptor plate 210. Similarly, a distance 116 between second portion 70 and arc portion 7 is not more than 1 mm in the direction parallel to bottom surface 61. Preferably, a distance between outer edge 34 and side surface 66 is not more than 1 mm around the entire circumference of outer edge 34 of silicon carbide single-crystal substrate 10. By setting the short distance of about not more than 1 mm between outer edge 34 and side surface 66, entry of the source material gas into the space between outer edge 34 and side surface 66 to cause disturbance in the flow of the source material gas can be suppressed. As a result, doping of a higher amount of nitrogen in the outer circumferential region than in the central region of silicon carbide single-crystal substrate 10 can be suppressed.

(Distance Between Outer Side Surface of Susceptor Plate and Side Surface of Recess)

Heating element 203 and susceptor plate 210 are heated using induction heating coil 206. The temperature of an outer circumferential corner 74 of susceptor plate 210 becomes higher than the temperature of a portion of susceptor plate 210 other than outer circumferential corner 74. As shown in FIG. 6, outer circumferential corner 74 of susceptor plate 210 is the point of contact between outer side surface 65 and a flat portion 72. Outer circumferential corner 74 has the highest temperature in susceptor plate 210. Thus, if the distance between outer circumferential corner 74 and silicon carbide single-crystal substrate 10 is short, the temperature of the outer circumferential region becomes higher than the temperature of the central region of silicon carbide single-crystal substrate 10. As a result, a higher amount of nitrogen is doped into the outer circumferential region than into the central region of silicon carbide single-crystal substrate 10. It is thus desirable to have a long distance between silicon carbide single-crystal substrate 10 and outer circumferential corner 74 of susceptor plate 210.

Specifically, a distance 119 between side surface 66 of recess 73 provided in susceptor plate 210 and outer circumferential corner 74 of susceptor plate 210 is not less than 20 mm, for example, in the direction parallel to bottom surface 61 (see FIGS. 6 and 8). Put another way, flat portion 72 of susceptor plate 210 has a width of not less than 20 mm. As shown in FIG. 8, distance 119 between first portion 69 and outer circumferential corner 74 may be not less than 20 mm in the radial direction. Similarly, a distance 117 between second portion 70 and outer circumferential corner 74 may be not less than 20 mm in the radial direction. Preferably, flat portion 72 has a width of not less than 20 mm around the entire circumference of susceptor plate 210.

Figure 9:
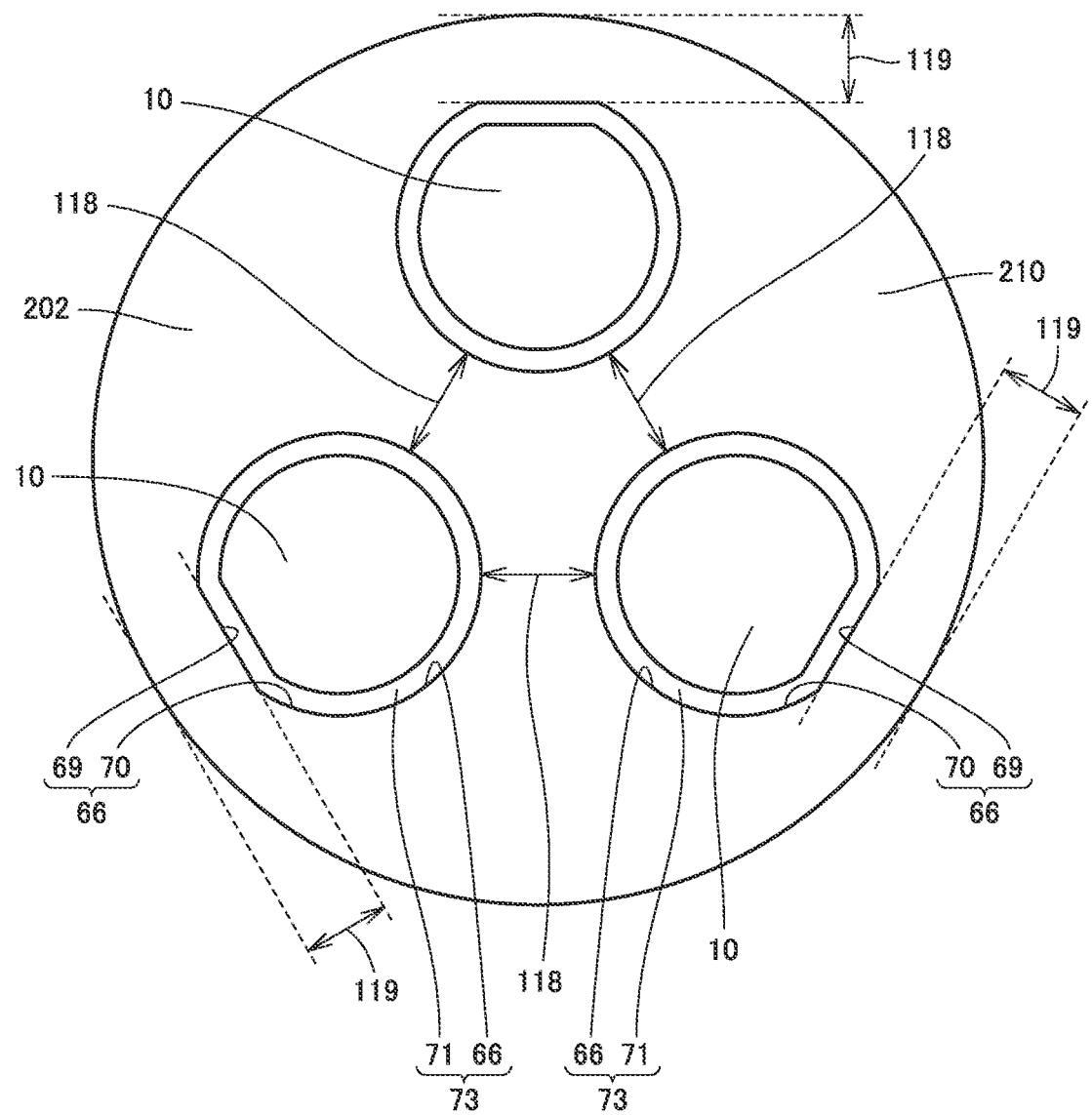
FIG. 9 is a schematic plan view showing the configuration of a second example of the susceptor plate of the manufacturing apparatus for the silicon carbide epitaxial substrate according to the present embodiment.

As shown in FIG. 9, susceptor plate 210 may be provided with a plurality of recesses 73. Although not particularly limited, the number of recesses 73 is three, for example. First portion 69 of side surface 66 of recess 73 may be parallel to a tangent of opposed outer side surface 65. First portion 69 may be located toward outer side surface 65 of susceptor plate 210, and second portion 70 may be located toward the center of susceptor plate 210. Preferably, a distance 118 between two recesses 73 is not less than 20 mm in the direction parallel to bottom surface 61. Preferably, distance 119 between first portion 69 and outer side surface 65 is not less than 20 mm in the direction parallel to bottom surface 61.

(Distance Between Surface of Silicon Carbide Single-Crystal Substrate and Flat Portion of Susceptor Plate)

When the thickness of silicon carbide single-crystal substrate 10 is smaller than a depth 115 of recess 73 provided in susceptor plate 210, a flow of the source material gas on silicon carbide single-crystal substrate 10 is disturbed. It is thus desirable for the thickness of silicon carbide single-crystal substrate 10 to be greater than depth 115 of recess 73. In other words, flat portion 72 is located between first main surface 11 and third main surface 13 in a direction perpendicular to first main surface 11. Specifically, a distance 114 between first main surface 11 and flat portion 72 is not more than 100 μm, for example, in the direction perpendicular to first main surface 11. When depth 115 of recess 73 is 300 μm and the thickness of silicon carbide single-crystal substrate 10 is 350 μm, for example, distance 114 is 50 μm. Accordingly, the disturbance in the flow of the source material gas on the silicon carbide single-crystal substrate can be effectively suppressed.

(Auxiliary Heating Mechanism)

It is desirable for ammonia gas, which serves as a dopant gas, to be heated sufficiently and thermally decomposed before being supplied to reaction chamber 201. It is expected that in-plane uniformity of nitrogen (dopant) density is thereby improved in silicon carbide layer 20. As shown in FIG. 5, auxiliary heating mechanism 211 is provided on the upstream side of reaction chamber 201. The ammonia gas can be heated in advance at auxiliary heating mechanism 211. Auxiliary heating mechanism 211 includes a chamber heated to not less than 1300° C., for example. The ammonia gas is thermally decomposed to a sufficient degree when passing through auxiliary heating mechanism 211, and then supplied to reaction chamber 201. With such a configuration, the ammonia gas can be thermally decomposed without causing significant disturbance in the gas flow.

The temperature of an inner wall surface of auxiliary heating mechanism 211 is more preferably not less than 1350° C. This is to facilitate the thermal decomposition of the ammonia gas. In view of thermal efficiency, the temperature of the inner wall surface of auxiliary heating mechanism 211 is preferably not more than 1600° C. Auxiliary heating mechanism 211 may be integrated with, or separated from, reaction chamber 201. The gas passed through auxiliary heating mechanism 211 may be only the ammonia gas, or may include another gas. The entire source material gas may be passed through auxiliary heating mechanism 211, for example.

(Method of Manufacturing Silicon Carbide Epitaxial Substrate)

Next, a method of manufacturing the silicon carbide epitaxial substrate according to the present embodiment is described.

First, a silicon carbide single crystal having a polytype of 6H is fabricated by sublimation, for example. Then, the silicon carbide single crystal is sliced by a wire saw, for example, whereby silicon carbide single-crystal substrate 10 is prepared. Silicon carbide single-crystal substrate 10 has first main surface 11, and third main surface 13 opposite to first main surface 11. First main surface 11 is a plane tilted not more than 8° from the {0001} plane, for example. As shown in FIGS. 5 and 6, silicon carbide single-crystal substrate 10 is disposed in recess 73 in susceptor plate 210 such that first main surface 11 is exposed at susceptor plate 210. Specifically, silicon carbide single-crystal substrate 10 is disposed in recess 73 such that flat portion 72 is located between first main surface 11 and third main surface 13 in the direction perpendicular to first main surface 11. Distance 114 between first main surface 11 and flat portion 72 is not more than 100 μm, for example, in the direction perpendicular to first main surface 11. Then, using manufacturing apparatus 200 described above, silicon carbide layer 20 is formed on silicon carbide single-crystal substrate 10 by epitaxial growth.

For example, after the pressure in reaction chamber 201 is lowered from atmospheric pressure to about $1 \times 10^{-6}$ Pa, a temperature rise of silicon carbide single-crystal substrate 10 is started. In the course of the temperature rise, hydrogen ($H_2$) gas serving as the carrier gas is introduced into reaction chamber 201.

After the temperature in reaction chamber 201 reaches about 1600° C., for example, the source material gas and the doping gas are introduced into reaction chamber 201. The source material gas includes a Si source gas and a C source gas. Silane (SiH$_4$) gas can be used, for example, as the Si source gas. Propane (C$_3$H$_8$) gas can be used, for example, as the C source gas. The silane gas and the propane gas have a flow rate of 46 sccm and 14 sccm, respectively, for example. A volume ratio of the silane gas to the hydrogen is 0.04%, for example. The source material gas has a C/Si ratio of 0.9, for example.

Ammonia (NH$_3$) gas is used, for example, as the doping gas. Ammonia gas is thermally decomposed more readily than nitrogen gas having a triple bond. It is expected that the use of ammonia gas will improve the in-plane uniformity of the carrier concentration. The ammonia gas has a concentration of 1 ppm, for example, relative to the hydrogen gas. It is desirable for the ammonia gas to be thermally decomposed by auxiliary heating mechanism 211 before being introduced into reaction chamber 201. The ammonia gas is heated to not less than 1300° C., for example, by auxiliary heating mechanism 211.

By introducing the carrier gas, the source material gas and the doping gas into reaction chamber 201 while heating silicon carbide single-crystal substrate 10 at about 1600° C., silicon carbide layer 20 is formed on silicon carbide single-crystal substrate 10 by epitaxial growth. During the epitaxial growth of silicon carbide layer 20, susceptor plate 210 rotates about a rotation axis 212 (see FIG. 5). An average rotational speed of susceptor plate 210 is 20 rpm, for example. In this manner, silicon carbide layer 20 is formed on silicon carbide single-crystal substrate 10 by epitaxial growth.

(Method of Manufacturing Silicon Carbide Semiconductor Device)

Next, a method of manufacturing a silicon carbide semiconductor device 300 according to the present embodiment is described.

Figure 10:
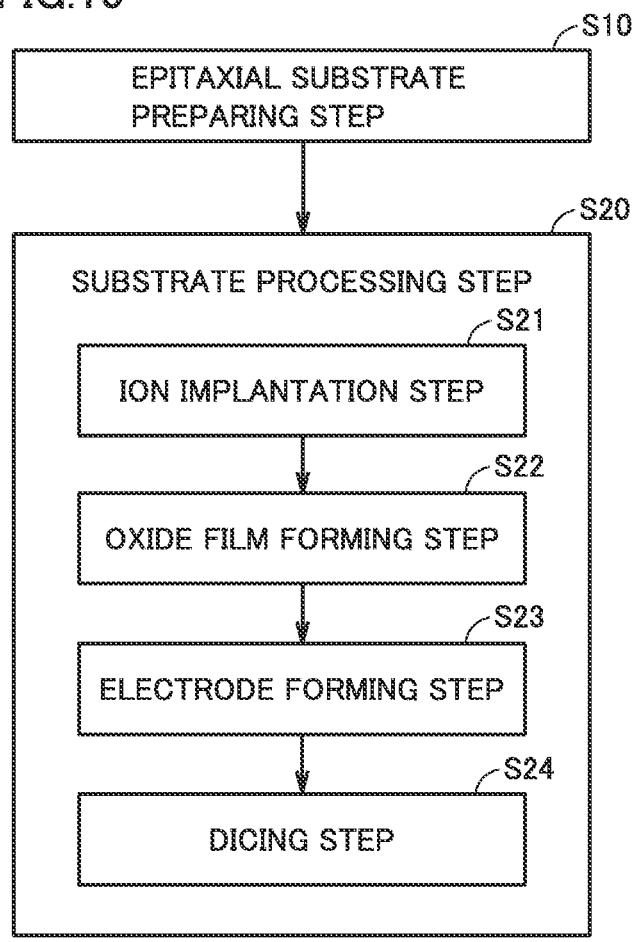
FIG. 10 is a flowchart showing an overview of a method of manufacturing a silicon carbide semiconductor device according to the present embodiment.

The method of manufacturing the silicon carbide semiconductor device according to the present embodiment mainly has an epitaxial substrate preparing step (S10: FIG. 10) and a substrate processing step (S20: FIG. 10).

First, the epitaxial substrate preparing step (S10: FIG. 10) is performed. Specifically, silicon carbide epitaxial substrate 100 is prepared by the method of manufacturing the silicon carbide epitaxial substrate described above (see FIG. 1).

Next, the substrate processing step (S20: FIG. 10) is performed. Specifically, the silicon carbide epitaxial substrate is processed to manufacture a silicon carbide semiconductor device. The "processing" includes various types of processing such as ion implantation, heat treatment, etching, oxide film formation, electrode formation, and dicing. That is, the substrate processing step may include at least any one of the types of processing including ion implantation, heat treatment, etching, oxide film formation, electrode formation, and dicing.

Described below is a method of manufacturing a MOSFET (Metal Oxide Semiconductor Field Effect Transistor) as an example silicon carbide semiconductor device. The substrate processing step (S20: FIG. 10) includes an ion implantation step (S21: FIG. 10), an oxide film forming step (S22: FIG. 10), an electrode forming step (S23: FIG. 10), and a dicing step (S24: FIG. 10).

First, the ion implantation step (S21: FIG. 10) is performed. A p type impurity such as aluminum (Al) is implanted into second main surface 30 on which a mask (not shown) with an opening has been formed. Consequently, a body region 132 having p type conductivity is formed. Then, an n type impurity such as phosphorus (P) is implanted into a prescribed position within body region 132. Consequently, a source region 133 having n type conductivity is formed.

Figure 11:
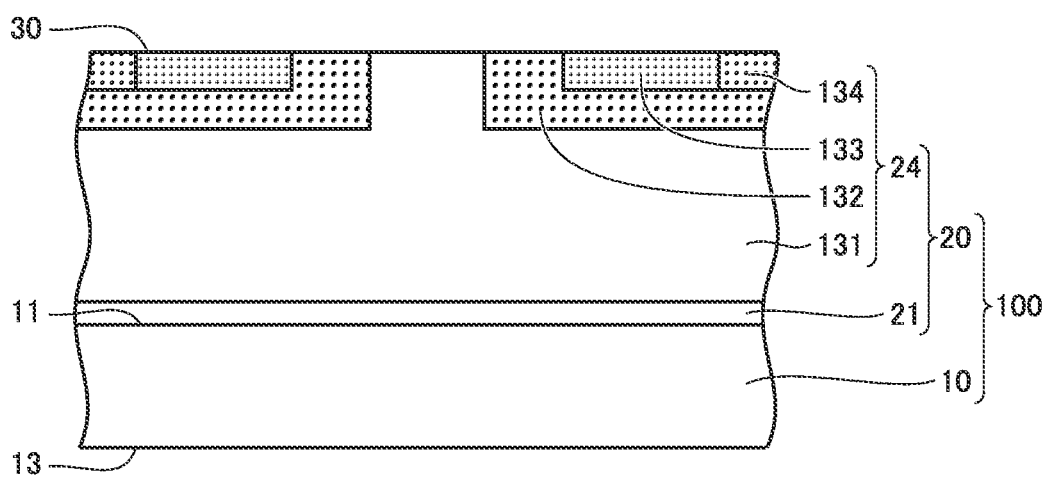
FIG. 11 is a schematic sectional view showing a first step of the method of manufacturing the silicon carbide semiconductor device according to the present embodiment.

Then, a p type impurity such as aluminum is implanted into a prescribed position within source region 133. Consequently, a contact region 134 having p type conductivity is formed (see FIG. 11).

In silicon carbide layer 20, a portion other than body region 132, source region 133 and contact region 134 serves as a drift region 131. Source region 133 is separated from drift region 131 by body region 132. The ion implantation may be performed while silicon carbide epitaxial substrate 100 is heated to about not less than 300° C. and not more than 600° C. After the ion implantation, silicon carbide epitaxial substrate 100 is subjected to activation annealing. The activation annealing activates the impurities implanted into silicon carbide layer 20, to generate a carrier in each region. The activation annealing may be performed in an argon (Ar) atmosphere, for example. The activation annealing may be performed at a temperature of about 1800° C., for example. The activation annealing may be performed for a period of about 30 minutes, for example.

Figure 12:
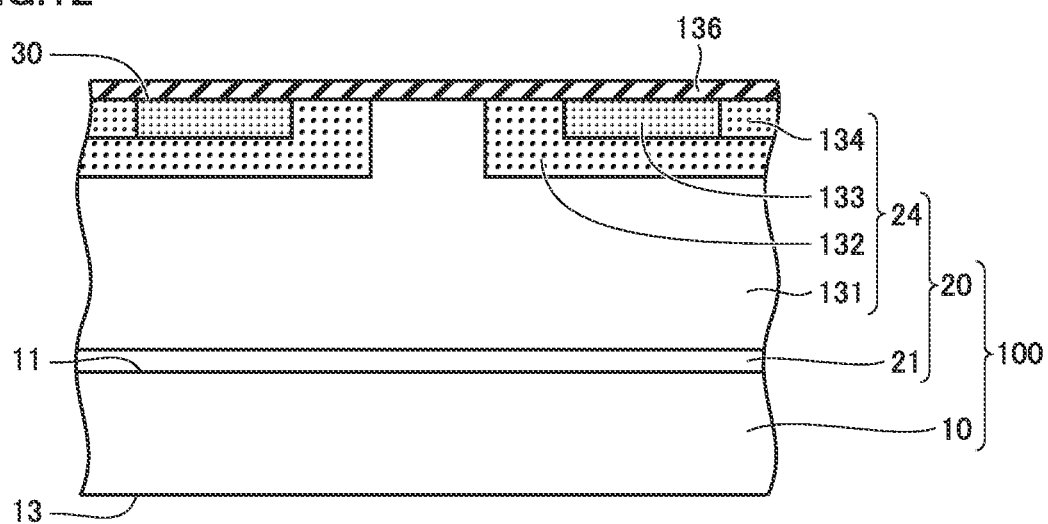
FIG. 12 is a schematic sectional view showing a second step of the method of manufacturing the silicon carbide semiconductor device according to the present embodiment.

Next, the oxide film forming step (S22: FIG. 10) is performed. Silicon carbide epitaxial substrate 100 is heated in an atmosphere including oxygen, for example, whereby an oxide film 136 is formed on second main surface 30 (see FIG. 12). Oxide film 136 is made of silicon dioxide (SiO$_2$), for example. Oxide film 136 serves as a gate insulating film. The thermal oxidation process may be performed at a temperature of about 1300° C., for example. The thermal oxidation process may be performed for a period of about 30 minutes, for example.

After oxide film 136 is formed, heat treatment may be further performed in a nitrogen atmosphere. For example, heat treatment may be performed in an atmosphere such as nitrogen monoxide (NO) or nitrous oxide (N$_2$O) at about 1100° C. for about one hour. Subsequently, heat treatment may be further performed in an argon atmosphere. For example, heat treatment may be performed in an argon atmosphere at about 1100 to 1500° C. for about one hour.

Next, the electrode forming step (S23: FIG. 10) is performed. A first electrode 141 is formed on oxide film 136. First electrode 141 serves as a gate electrode. First electrode 141 is formed by CVD, for example. First electrode 141 is made of polysilicon including an impurity and having conductivity, for example. First electrode 141 is formed at a position facing source region 133 and body region 132.

Next, an interlayer insulating film 137 is formed to cover first electrode 141. Interlayer insulating film 137 is formed by CVD, for example. Interlayer insulating film 137 is made of silicon dioxide, for example. Interlayer insulating film 137 is formed in contact with first electrode 141 and oxide film 136. Then, oxide film 136 and interlayer insulating film 137 at a prescribed position are removed by etching. Consequently, source region 133 and contact region 134 are exposed at oxide film 136.

A second electrode 142 is formed at this exposed portion by sputtering, for example. Second electrode 142 serves as a source electrode. Second electrode 142 is made of titanium, aluminum and silicon, for example. After second electrode 142 is formed, second electrode 142 and silicon carbide epitaxial substrate 100 are heated at a temperature of about 900 to 1100° C., for example. Consequently, second electrode 142 and silicon carbide epitaxial substrate 100 are brought into ohmic contact with each other. Then, a wiring layer 138 is formed in contact with second electrode 142. Wiring layer 138 is made of a material including aluminum, for example.

Next, a third electrode 143 is formed on third main surface 13. Third electrode 143 serves as a drain electrode.

Third electrode 143 is made of an alloy including nickel and silicon, for example (NiSi, for example).

Figure 13:
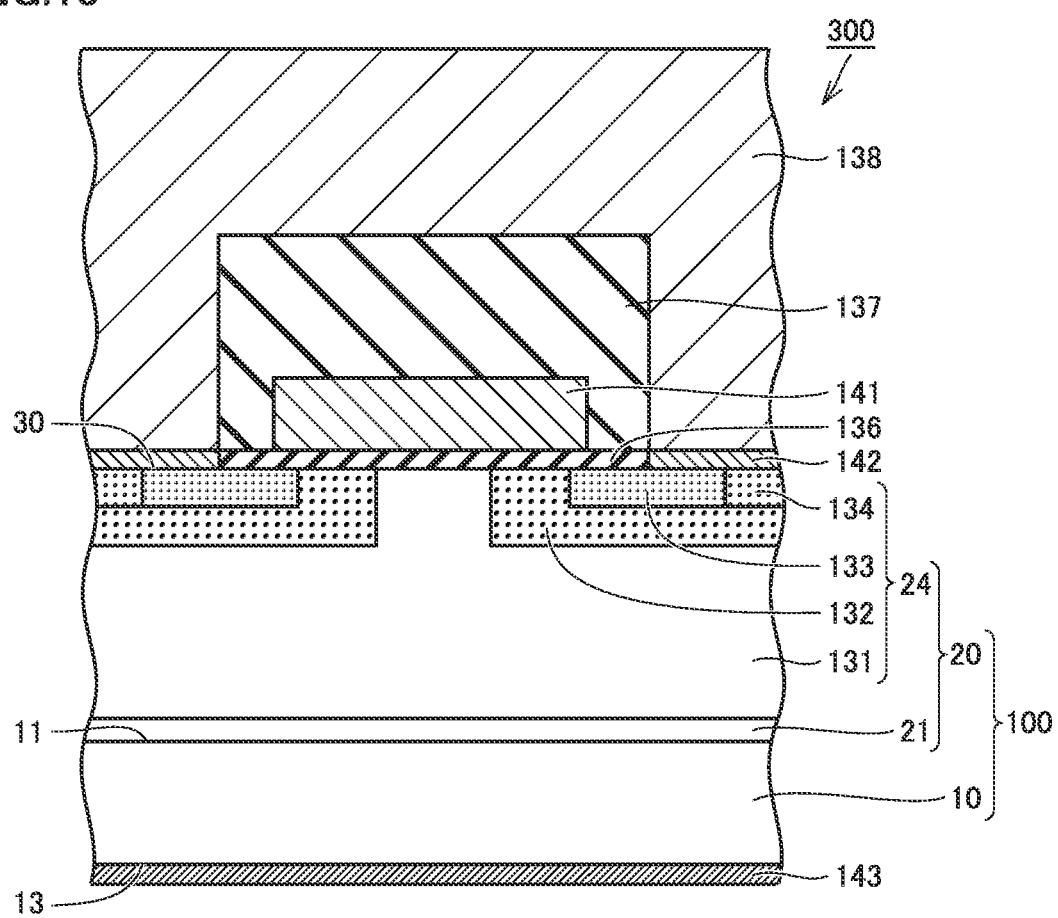
FIG. 13 is a schematic sectional view showing a third step of the method of manufacturing the silicon carbide semiconductor device according to the present embodiment.

Next, the dicing step (S24: FIG. 10) is performed. For example, silicon carbide epitaxial substrate 100 is diced along dicing lines, whereby silicon carbide epitaxial substrate 100 is divided into a plurality of semiconductor chips. In this manner, silicon carbide semiconductor device 300 is manufactured (see FIG. 13).

Although the method of manufacturing the silicon carbide semiconductor device according to the present disclosure has been described above with reference to a MOSFET as an example, the manufacturing method according to the present disclosure is not limited as such. The manufacturing method according to the present disclosure can be applied to various types of silicon carbide semiconductor devices such as an IGBT (Insulated Gate Bipolar Transistor), an SBD (Schottky Barrier Diode), a thyristor, a GTO (Gate Turn Off thyristor), and a PiN diode.

It should be understood that the embodiments disclosed herein are illustrative and non-restrictive in every respect. The scope of the present invention is defined by the terms of the claims, rather than the embodiments described above, and is intended to include any modifications within the scope and meaning equivalent to the terms of the claims.

REFERENCE SIGNS LIST 3, 4 plane; 5 orientation flat; 7 arc portion; 10 silicon carbide single-crystal substrate; 11 first main surface; 13 third main surface; 14 fourth main surface (surface); 20 silicon carbide layer; 21 buffer layer; 24 drift layer; 30 second main surface; 31 first end region; 32 second end region; 33 central region; 34 outer edge; 35 center; 36 third end region; 37 fourth end region; 53 MFC; 54 gas supply source; 61, 62, 71 bottom surface; 63 gas ejection hole; 64 flow path; 65 outer side surface; 66, 67 side surface; 68, 73 recess; 69 first portion; 70 second portion; 72 flat portion; 74 outer circumferential corner; 100 silicon carbide epitaxial substrate; 101 first direction; 102 second direction; 103 circumferential direction; 111 maximum diameter; 122 shortest distance; 131 drift region; 132 body region; 133 source region; 134 contact region; 136 oxide film; 137 interlayer insulating film; 138 wiring layer; 141 first electrode; 142 second electrode; 143 third electrode; 200 manufacturing apparatus; 201 reaction chamber; 203 heating element; 204 quartz tube; 205 heat insulator; 206 induction heating coil; 207 gas inlet port; 208 gas outlet port; 210 susceptor plate; 211 auxiliary heating mechanism; 212 rotation axis; 300 silicon carbide semiconductor device.

The invention claimed is:

1. A silicon carbide epitaxial substrate comprising:
a silicon carbide single-crystal substrate including a first main surface; and
a silicon carbide layer on the first main surface,
the silicon carbide layer including a second main surface and a fourth main surface, the second main surface being opposite to the fourth main surface in direct contact with the silicon carbide single-crystal substrate,
the second main surface having a maximum diameter of not less than 100 mm and not more than 300 mm,
the silicon carbide single-crystal substrate and the silicon carbide layer being provided with a linear orientation flat,
the silicon carbide layer having a central region, a first end region and a second end region,
the central region being located 2 μm away from a center of the second main surface toward the first main surface in a direction perpendicular to the second main surface,
the first end region being located 2 μm away from the second main surface toward the first main surface in a direction perpendicular to the second main surface, and being located 1 mm away from the orientation flat toward the central region,
the second end region being located 2 μm away from the second main surface toward the first main surface in a direction perpendicular to the second main surface and in a direction circumferentially rotated 90° counterclockwise from the first end region when viewed from above the second main surface so that the silicon carbide layer is on other side of the second main surface, and being located 1 mm away from an outer edge of the silicon carbide layer toward the central region,
the silicon carbide layer having a thickness of not less than 5 μm and not more than 15 μm,
a first ratio of an absolute value of a difference between a dopant density in the first end region and a dopant density in the central region to an average value of the dopant density in the first end region and the dopant density in the central region being more than 20% and not more than 40%,
a second ratio of an absolute value of a difference between a dopant density in the second end region and the dopant density in the central region to an average value of the dopant density in the second end region and the dopant density in the central region being more than 20% and not more than 40%.

2. The silicon carbide epitaxial substrate according to claim 1, wherein
the first ratio is not more than 30%.

3. The silicon carbide epitaxial substrate according to claim 1, wherein
the second ratio is not more than 30%.

4. The silicon carbide epitaxial substrate according to claim 1, wherein
the maximum diameter is not less than 150 mm.

5. A method of manufacturing a silicon carbide semiconductor device, comprising:
preparing the silicon carbide epitaxial substrate according to claim 1; and
processing the silicon carbide epitaxial substrate.

* * * * *